United States Patent
Wong

(10) Patent No.: US 7,162,673 B2
(45) Date of Patent: Jan. 9, 2007

(54) SCAN CHAIN REGISTERS THAT UTILIZE FEEDBACK PATHS WITHIN LATCH UNITS TO SUPPORT TOGGLING OF LATCH UNIT OUTPUTS DURING ENHANCED DELAY FAULT TESTING

(75) Inventor: Tak Kwong Wong, Milpitas, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 259 days.

(21) Appl. No.: 10/933,772

(22) Filed: Sep. 3, 2004

(65) Prior Publication Data

US 2005/0108604 A1   May 19, 2005

Related U.S. Application Data

(60) Provisional application No. 60/520,213, filed on Nov. 14, 2003.

(51) Int. Cl.
*G01R 31/28* (2006.01)
(52) U.S. Cl. .................................................. 714/726
(58) Field of Classification Search ................ 714/726, 714/727, 729
See application file for complete search history.

(56) References Cited

U.S. PATENT DOCUMENTS

| | | | |
|---|---|---|---|
| 4,740,970 A | 4/1988 | Burrows et al. | |
| 4,875,003 A | 10/1989 | Burke | |
| 4,912,709 A * | 3/1990 | Teske et al. | 714/724 |
| 5,450,455 A | 9/1995 | Hamilton et al. | |
| 5,488,318 A | 1/1996 | Vajapey et al. | |
| 5,504,756 A | 4/1996 | Kim et al. | |
| 5,524,114 A | 6/1996 | Peng | |
| 5,550,843 A | 8/1996 | Yee | |
| 5,592,493 A | 1/1997 | Crouch et al. | |
| 5,602,855 A | 2/1997 | Whetsel, Jr. | |
| 5,671,235 A | 9/1997 | Bosch et al. | |
| 5,675,589 A | 10/1997 | Yee | |
| 5,677,917 A | 10/1997 | Wheelus et al. | |

(Continued)

FOREIGN PATENT DOCUMENTS

EP     0 402 134 A2    12/1990

(Continued)

OTHER PUBLICATIONS

Notification of Transmittal of the International Search Report and the Written Opinion of the International Searching Authority, or the Declaration, PCT/US2004/037546, Mar. 9, 2005.

(Continued)

*Primary Examiner*—James C Kerveros
(74) *Attorney, Agent, or Firm*—Myers Bigel Sibley & Sajovec PA

(57) ABSTRACT

An integrated circuit device utilizes a serial scan chain register to support efficient reliability testing of internal circuitry that is not readily accessible from the I/O pins of the device. The scan chain register has scan chain latch units that support a toggle mode of operation. The scan chain register is provided with serial and parallel input ports and serial and parallel output ports. Each of the plurality of scan chain latch units includes a latch element and additional circuit elements that are configured to selectively establish a feedback path in the respective latch unit. This feedback path operates to pass an inversion of a signal at an output of the latch to an input of the latch when the corresponding scan chain latch unit is enabled to support a toggle mode of operation.

7 Claims, 15 Drawing Sheets

U.S. PATENT DOCUMENTS

| | | | |
|---|---|---|---|
| 5,689,517 A | 11/1997 | Ruparel | |
| 5,701,335 A | 12/1997 | Neudeck | |
| 5,745,724 A | 4/1998 | Favor et al. | |
| 5,748,497 A | 5/1998 | Scott et al. | |
| 5,748,646 A | 5/1998 | Hosokawa | |
| 5,774,474 A | 6/1998 | Narayanan et al. | |
| 5,812,561 A | 9/1998 | Giles et al. | |
| 5,828,579 A | 10/1998 | Beausang | |
| 5,831,993 A | 11/1998 | Graef | |
| 5,867,036 A | 2/1999 | Rajsuman | |
| 5,881,067 A | 3/1999 | Narayanan et al. | |
| 5,900,753 A | 5/1999 | Cote et al. | |
| 5,909,451 A | 6/1999 | Lach et al. | |
| 5,949,692 A | 9/1999 | Beausang et al. | |
| 5,978,944 A | 11/1999 | Parvathala et al. | |
| 5,991,908 A | 11/1999 | Baxter et al. | |
| 6,032,278 A | 2/2000 | Parvathala et al. | |
| 6,059,451 A | 5/2000 | Scott et al. | |
| 6,065,145 A | 5/2000 | Bencivenga | |
| 6,070,259 A | 5/2000 | Roisen et al. | |
| 6,091,261 A | 7/2000 | De Lange | |
| 6,106,568 A | 8/2000 | Beausang et al. | |
| 6,125,464 A | 9/2000 | Jin | |
| 6,134,517 A | 10/2000 | Baxter et al. | |
| 6,148,425 A | 11/2000 | Bhawmik et al. | |
| 6,185,710 B1 | 2/2001 | Barnhart | |
| 6,212,656 B1 | 4/2001 | Fosco et al. | |
| 6,247,154 B1 | 6/2001 | Bushnell et al. | |
| 6,271,683 B1 | 8/2001 | Horne et al. | |
| 6,286,119 B1 | 9/2001 | Wu et al. | |
| 6,308,290 B1 | 10/2001 | Forlenza et al. | |
| 6,314,539 B1 | 11/2001 | Jacobson et al. | |
| 6,327,685 B1 | 12/2001 | Koprowski et al. | |
| 6,381,722 B1 | 4/2002 | Salmon et al. | |
| 6,405,334 B1 | 6/2002 | Tien | |
| 6,415,405 B1 | 7/2002 | Horne et al. | |
| 6,442,722 B1 | 8/2002 | Nadeau-Dostie et al. | |
| 6,453,436 B1 | 9/2002 | Rizzolo et al. | |
| 6,480,019 B1 | 11/2002 | Waldie et al. | |
| 6,490,702 B1 | 12/2002 | Song et al. | |
| 6,496,966 B1 | 12/2002 | Barney et al. | |
| 6,539,509 B1 | 3/2003 | Teene | |
| 6,574,762 B1 | 6/2003 | Karimi et al. | |
| 6,581,190 B1 | 6/2003 | Dixon et al. | |
| 6,590,929 B1 | 7/2003 | Williams | |
| 6,598,150 B1 | 7/2003 | Williams et al. | |
| 6,598,192 B1 | 7/2003 | McLaurin et al. | |
| 6,640,324 B1 | 10/2003 | Goldovsky | |
| 6,681,356 B1 | 1/2004 | Gerowitz et al. | |
| 6,698,004 B1 | 2/2004 | Satish et al. | |
| 7,028,238 B1 * | 4/2006 | Korger et al. | 714/727 |

FOREIGN PATENT DOCUMENTS

| | | |
|---|---|---|
| EP | 1 357 388 A2 | 10/2003 |
| JP | 11-248793 | 9/1999 |

OTHER PUBLICATIONS

Synopsys Data Sheet, TetraMAX ATPG—Automatic test pattern generation, 2001, 4 pages.

Synopsys Products & Solutions, TetraMAX ATPG—Automatic test pattern generation, http://www.synopsys.com/products/test/tetramax_ds.html, Oct. 18, 2001, 6 pages.

TetraMAX DSMTest, Path Delay Fault Testing, Chapter 13, pp. 313-337, undated.

Test Technology Overview, Module 43, RASSP Education & Facilitation Program, Jun. 1998, Slides 1 and 84-94.

* cited by examiner

SCAN CHAIN REGISTERS THAT UTILIZE FEEDBACK PATHS WITHIN LATCH UNITS TO SUPPORT TOGGLING OF LATCH UNIT OUTPUTS DURING ENHANCED DELAY FAULT TESTING

REFERENCE TO RELATED APPLICATION

This application claims priority to U.S. Provisional Application Ser. No. 60/520,213, filed Nov. 14, 2003, the disclosure of which is hereby incorporated herein by reference.

FIELD OF THE INVENTION

The present invention relates to integrated circuit devices and methods of operating same, and more particularly to integrated circuit devices that utilize scan chains to facilitate device testing.

BACKGROUND OF THE INVENTION

Scan design test techniques are frequently used to facilitate testing of complicated integrated circuit devices. A variety of these techniques are disclosed in U.S. Pat. Nos. 6,453,456 and 6,490,702. In particular, FIG. 10 of the '702 patent discloses a scan chain circuit 110 that purports to solve a latch adjacency problem when testing for delay faults within an integrated circuit. This scan chain circuit 110 includes a plurality of shift register latches 30 that operate as stages within the scan chain circuit 110. One shift register latch is illustrated as including a master latch 32a and a slave latch 34a. The output of the slave latch 34a is provided to a first input of a combinational logic device 122. This combinational logic device 122 is illustrated as a two-input AND gate. The output of the slave latch 34a is also provided to a first input of a multiplexer 112a, which is responsive to a select signal SEL. A second inverted input 116 of the multiplexer 112a also receives the output of the slave latch 34a. The output of the multiplexer 112a is provided to an input of a next shift register latch within the scan chain circuit. This next shift register latch is illustrated as including a master latch 32b and a slave latch 34b. The output of the slave latch 34b is provided to a second input of the combinational logic device 122. This combinational logic device 122 is illustrated as undergoing a conventional delay fault test by having one input of the device 122 switch low-to-high while the other input of the device 122 is held high. The timing of this low-to-high switching of the one input of the device 122 is synchronized with a leading edge of the next clock pulse (not shown). To facilitate this delay fault test, the second inverted input 116 of the multiplexer 112a is selected (i.e., SEL=0) so that the output of the next shift register latch (i.e., output of the slave latch 34b) is held at a logic 1 level when the next clock pulse is received.

Accordingly, based on the illustrated configuration of the shift register latches 30 within the scan chain circuit, a value of the select signal SEL can be used to control whether the multiplexers 112a–112c operate to pass a true or complementary version of the output of a respective slave latch 34a–34c to the next shift register latch within the scan chain circuit 110. Nonetheless, even if the output of the slave latch 34a can be controlled to switch states (i.e., switch 0→1 or 1→0) in response to the clock pulse (not shown), an output of the next shift register latch within the scan chain circuit (i.e., the output of the slave latch 34b) will nonetheless be a function of a value of the output of the preceding slave latch 34a during the delay fault test operation. This functional dependency between the output of one shift register latch and the output of a preceding shift register latch during the fault test operation can limit the effectiveness of the scan chain circuit when testing for other more complicated types of delay faults within an integrated circuit device.

SUMMARY OF THE INVENTION

Embodiments of the present invention include an integrated circuit device that utilizes a scan chain register to support efficient reliability testing of internal circuitry that is not readily accessible from the I/O pins of the device. This reliability testing includes the performance of, among other things, delay fault and stuck-at fault testing of elements within the internal circuitry. According to some of these embodiments, an integrated circuit device is provided with a scan chain register having a plurality of scan chain latch units therein that support a toggle mode of operation. The scan chain register is provided with serial and parallel input ports and serial and parallel output ports. Each of the plurality of scan chain latch units includes a latch element and additional circuit elements that are configured to selectively establish at least one feedback path in the respective latch unit. This feedback path can operate to pass an inversion of a signal at an output of the latch to an input of the latch when the corresponding scan chain latch unit is enabled to support the toggle mode of operation. Accordingly, if the output of the latch is set to a logic 1 level, then a toggle operation will cause the output of the latch to automatically switch to a logic 0 level and vice versa. Because of the presence of a respective feedback path within each scan chain latch unit, the toggle operation at the output of a scan chain latch unit will be independent of the value of any other output of any other scan chain latch unit within the scan chain.

According to additional embodiments of the present invention, a scan chain latch unit includes a latch and a pair of multiplexers that route data through the latch unit. The latch may constitute a flip-flop device that is synchronized to a clock signal, such as a positive edge triggered D-type flip-flop. In particular, a first multiplexer is provided having first and second data inputs and a select terminal that is responsive to a toggle signal. A second multiplexer is provided having a first data input electrically coupled to an output of the first multiplexer, a second data input configured as a parallel input port of the scan chain latch unit, a select terminal responsive to a scan enable signal ($SE_i$) and an output electrically coupled to an input of the latch. The scan chain latch unit further includes an inverter having an input electrically coupled to a true output of the latch and an output electrically coupled to the second data input of the first multiplexer. Accordingly, through proper control of the select terminals of the first and second multiplexers, a signal generated at an output of the inverter can be passed to the input of the latch and then loaded into the latch upon performance of the toggle operation. In the event the latch includes true and complementary outputs, then the complementary output may be fed back directly to the second data input of the first multiplexer and the inverter may be eliminated.

Further embodiments of the present invention include a sequential scan chain register having a serial input port, a serial output port and a plurality of parallel output ports. The sequential scan chain register is configured to generate at least a first portion of a serially scanned-in test vector at a plurality of immediately adjacent ones of the parallel output ports during a preload time interval that spans multiple consecutive cycles of a clock signal. This register is further configured to respond to a launch edge of the clock signal and an active toggle signal by toggling each and every one of the bits in the first portion of the serially scanned-in vector regardless of a value of the serially scanned-in vector.

According to still further embodiments of the present invention, a scan chain latch unit is configured to support a toggle mode of operation that establishes a next output state (NS) of the scan chain latch unit as an invert of a current output state (CS) of the scan chain latch unit, while blocking data at serial and parallel inputs of the scan chain latch unit from influencing a value of the next output state. The scan chain latch unit is further configured to support a freeze mode of operation that establishes a next output state of the scan chain latch unit as equivalent to a current output state of the scan chain latch unit. This mode of operation also blocks data at the serial and parallel inputs of the scan chain latch unit from influencing a value of the next output state. In these embodiments, the scan chain latch unit may include a four input multiplexer that is responsive to a pair of select signals. The scan chain latch unit may also generate a true output state (Q) that is fed back to a first data input of the four input multiplexer and a complementary output state (QB) that is fed back to a second data input of the four input multiplexer. The four input multiplexer may include first and second totem pole arrangements of PMOS and NMOS transistors having commonly connected outputs.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The suffix B or prefix symbol "/" to a signal name may denote a complementary data or information signal or an active low control signal, for example.

Figure 1A:
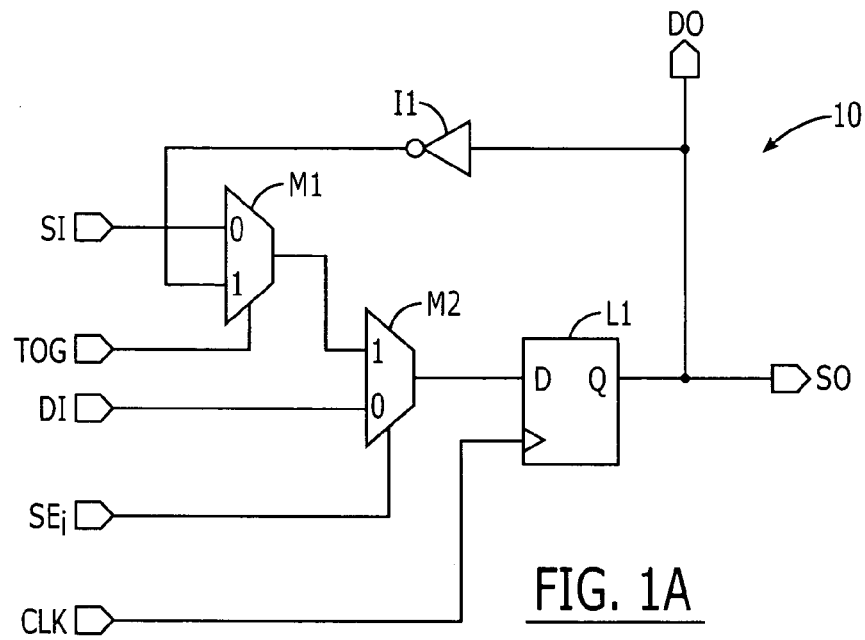
FIG. 1A is an electrical schematic of a scan chain latch unit according to an embodiment of the present invention.

Referring now to FIG. 1A, a scan chain latch unit 10 according to an embodiment of the present invention is illustrated as including first and second multiplexers M1 and M2, a latch L1 and an inverter I1. The latch L1 is shown as a D-type flip-flop having an input D and a "true" output Q that is fed back to an input of the inverter I1. The latch L1 is synchronized to a clock signal CLK. As described more fully hereinbelow with respect to FIG. 2B, the latch L1 may also be configured as a flip-flop having true and complementary outputs Q and QB and the inverter I1 may be eliminated. Other types of latches may also be used. The scan chain latch unit 10 has a number of ports. These ports include a serial input port SI, a serial output port SO, a parallel input port DI and a parallel output port DO. The first multiplexer M1 has a select terminal that is responsive to a toggle signal TOG and the second multiplexer M2 has a select terminal that is responsive to a scan enable signal $SE_i$. When the toggle signal TOG is set to a logic 0 level (i.e., low state) and the scan enable signal $SE_i$ is set to a logic 1 level (i.e., high state), serial input data can be passed from the serial input port SI to the input D of the latch L1 and then transferred to the output Q of the latch L1 in-sync with a rising edge of the clock signal CLK. Alternatively, when the scan enable signal $SE_i$ is set to a logic 0 level, parallel input data can be passed from the parallel input port DI to the input D of the latch L1. Finally, in preparation of a toggle operation, both the toggle signal TOG and the scan enable signal $SE_i$ can be set to logic 1 levels to thereby connect an output of the inverter I1 to the input D of the latch L1. In this manner, an inversion of the output Q of the latch L1 can be passed to the input D of the latch L1. Stated alternatively, setting both the toggle signal TOG and the scan enable signal $SE_i$ to logic 1 levels will operate to establish an active feedback path that passes an inversion of a signal from the output Q of the latch L1 to the input D of the latch L1. Then, upon receipt of a leading "launch" edge of the clock signal CLK, the output Q of the latch will undergo a toggle operation (i.e., switch high-to-low or low-to-high).

Figure 1B:
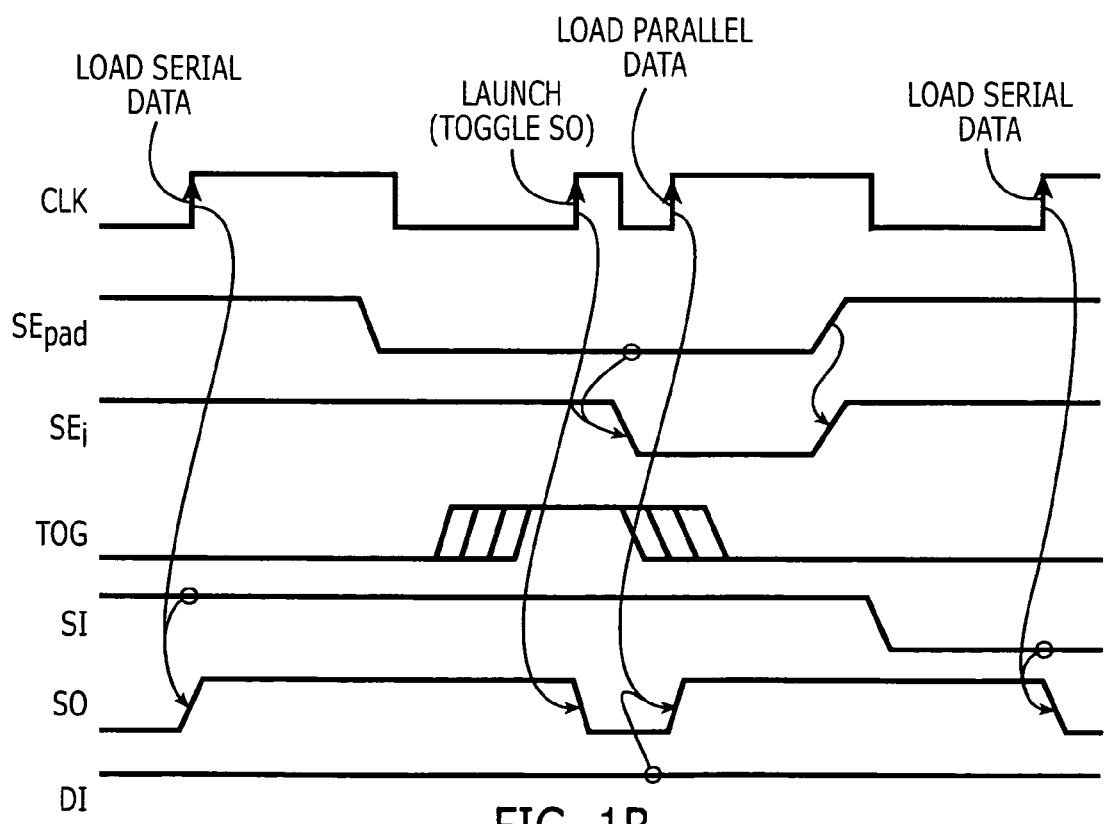
FIG. 1B is a timing diagram that illustrates operation of the scan chain latch unit of FIG. 1A.

The timing diagram of FIG. 1B also illustrates operation of the scan chain latch unit 10 of FIG. 1A. In FIG. 1B, the clock signal CLK is shown as having an initial leading edge that operates to synchronize the loading of data from the serial input port SI to the serial output port SO. This leading edge is received while the toggle signal TOG is held at a logic 0 level and the scan enable signal $SE_i$ is held at a logic 1 level. These settings establish a data path that extends from the serial input port SI to the input D of the latch L1, via the first and second multiplexers M1 and M2. After this initial loading operation, the toggle signal TOG is switched low-to-high and the scan enable pad signal $SE_{pad}$ is switched high-to-low in advance of the next leading edge of the clock signal CLK, which is referred to herein as the launch edge of the clock signal CLK. The timing of when the toggle signal TOG switches low-to-high is somewhat flexible because it is only necessary that the low-to-high transition of TOG occur after the serial data has been loaded (i.e., after the initial leading edge of the clock signal CLK has been received) and before the launch edge of the clock signal CLK is received. As illustrated by the scan enable signal generator 12 of FIG. 1C, which includes a latch L2, a NOR gate NR1 and an inverter I2, switching the scan enable pad signal $SE_{pad}$ high-to-low in advance of the launch edge of the clock signal CLK will cause the scan enable signal $SE_i$ to switch high-to-low in-sync with the launch edge of the clock signal CLK. When this occurs, a data path between the parallel data input DI of the scan chain latch unit 10 and the data input D of the latch L1 will be enabled. The signal generator 12 of FIG. 1C has the advantage of being responsive to the scan enable pad signal $SE_{pad}$, which, as illustrated by FIG. 1B, has more relaxed timing requirements and can be more easily distributed within a chip (with the scan enable signal $SE_i$ being separated for each block within the chip).

Figure 1C:
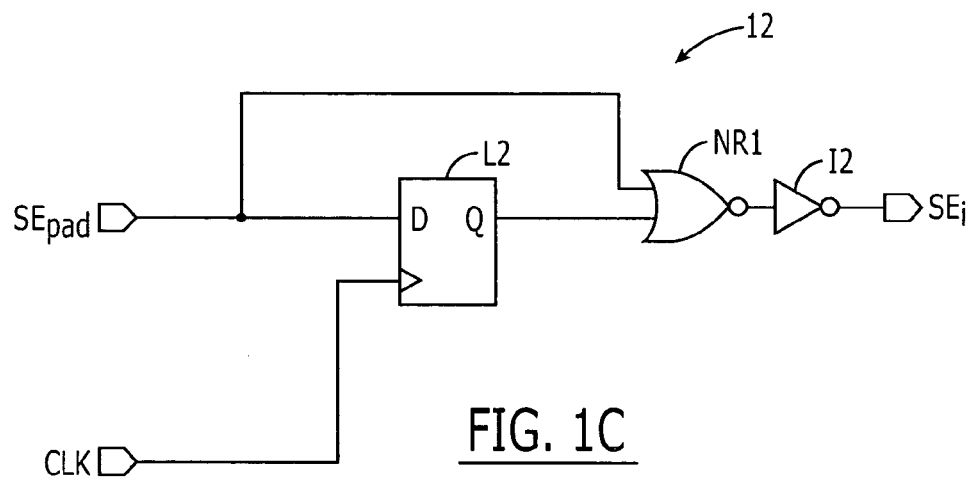
FIG. 1C is an electrical schematic of a scan enable signal $SE_i$ generator according to an embodiment of the present invention.

Upon receipt of the launch edge of the clock signal CLK, the true output Q of the latch L1 will undergo a toggle operation by switching from a previously loaded high state to a low state. The toggle operation is made automatic because both the toggle signal TOG and the scan enable signal $SE_i$ are high at the moment the launch edge of the clock signal CLK is received, which means the feedback path between the output of the inverter I1 and the input D of the latch L1 is enabled pending receipt of the launch edge. Following this, the scan enable signal $SE_i$ switches high-to-low to thereby enable the true output Q of the latch L1 to switch to the current value of the parallel data input DI upon receipt of the next leading edge of the clock signal CLK that follows the launch edge. After this next leading edge, the scan enable pad signal $SE_{pad}$ switches low-to-high and the scan enable signal $SE_i$ follows in-sync with the rising edge of the scan enable pad signal $SE_{pad}$ signal, as illustrated by FIG. 1C. Setting the scan enable signal $SE_i$ high while the toggle signal TOG remains low will operate to connect the serial input port SI to the data input D of the latch L1. The data at the serial input port SI will then be passed to the true output Q of the latch L1 in-sync with the next leading edge of the clock signal CLK, which is shown as the final leading edge illustrated by FIG. 1B.

Figure 1D:
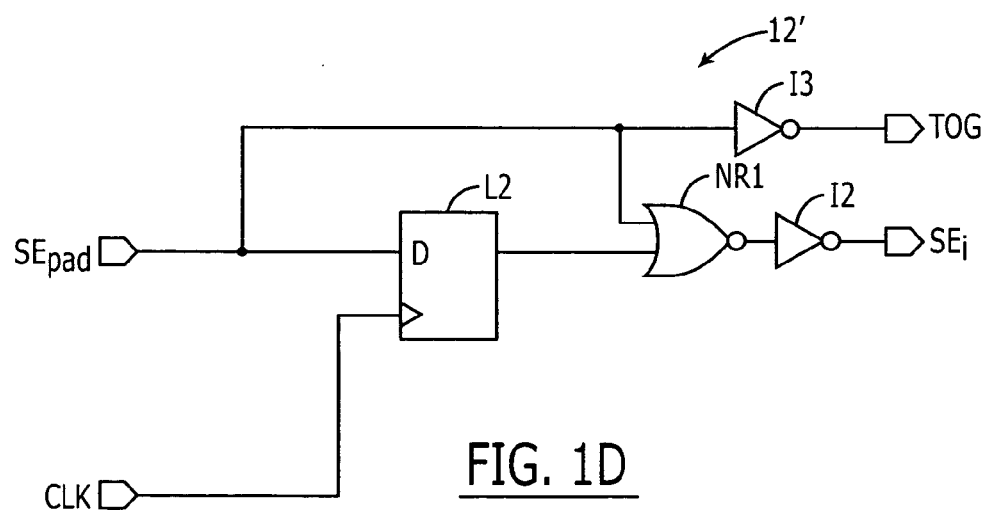
FIG. 1D is an electrical schematic of a circuit that is configured to generate scan enable and toggle signals, which are received by the scan chain latch unit of FIG. 1A.

Control of the generation of the toggle signal TOG in FIG. 1B may be independent of the scan enable pad $SE_{pad}$ signal in some embodiments of the present invention. In particular, separate bond pads may be provided on an integrated circuit substrate and these bond pads may be electrically coupled to separate pins of an integrated circuit package that is configured to receive the scan enable pad $SE_{pad}$ signal and the toggle signal TOG, respectively. However, in other embodiments, the toggle signal TOG may be generated by an alternative scan enable signal generator 12', which is illustrated by FIG. 1D. In particular, the toggle signal TOG may be generated at the output of an inverter I3, which receives the scan enable pad signal $SE_{pad}$ as an input signal. Thus, in the timing diagram of FIG. 1B, the timing of the toggle signal TOG may be modified so that it is set high when the scan enable pad signal $SE_{pad}$ switches low and set low when the scan enable pad signal $SE_{pad}$ switches high.

Figure 2A:
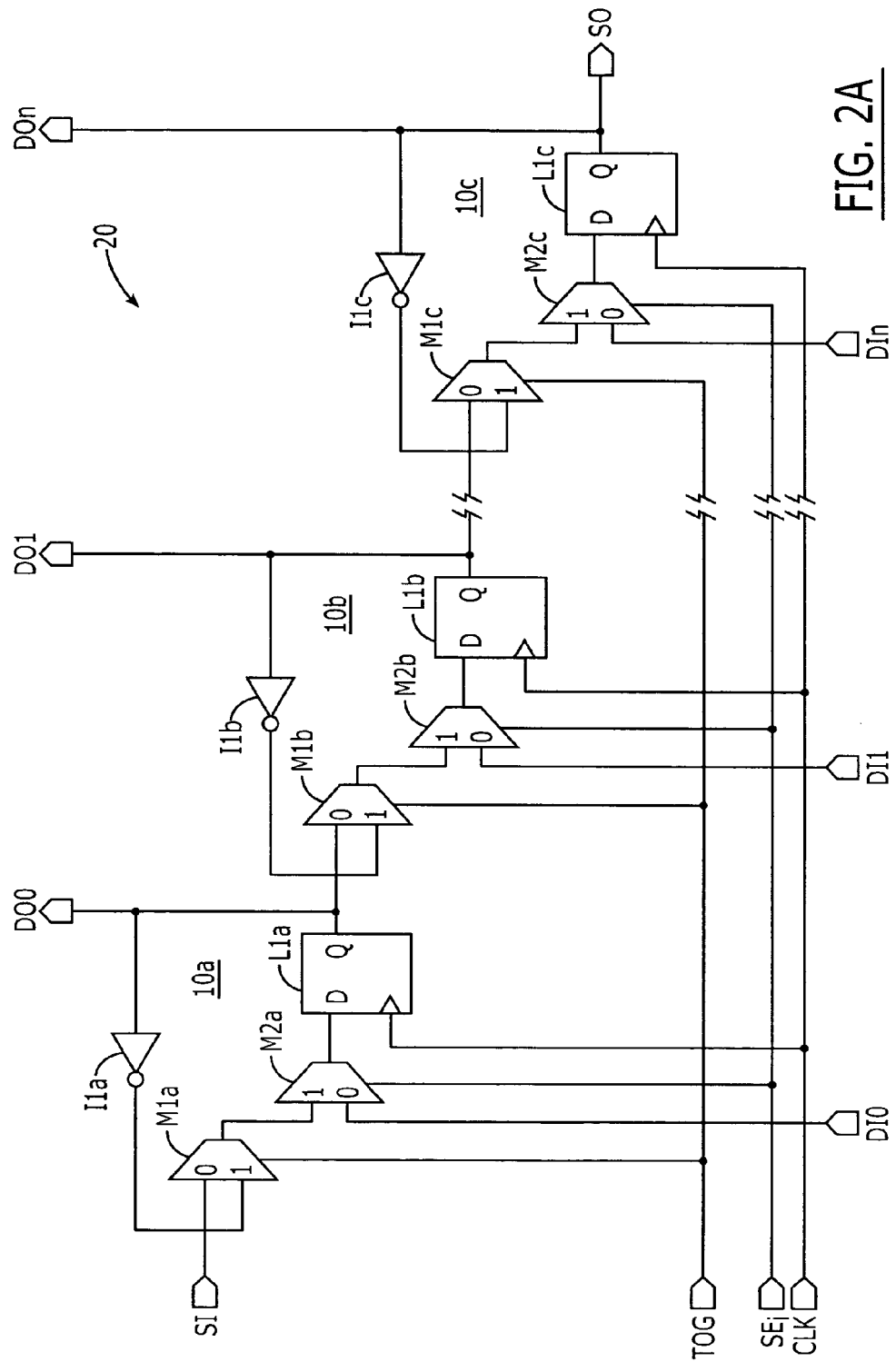
FIG. 2A is an electrical schematic of a portion of a scan chain register according to an embodiment of the present invention.

FIG. 2A illustrates a scan chain register 20 according to an embodiment of the present invention. This scan chain register 20 is illustrated as including a plurality (i.e., n+1) of the scan chain latch units 10 illustrated by FIG. 1A. These scan chain latch units are shown by the reference numerals 10a–10c. The first scan chain latch unit 10a includes first and second multiplexers M1a, M2a, a D-type latch L1a and an inverter I1a. The second scan chain latch unit 10b includes first and second multiplexers M1b, M2b, a D-type latch L1b and an inverter I1b. The last scan chain latch unit 10c within the scan chain register 20 includes first and second multiplexers M1c, M2c, a D-type latch L1c and an inverter I1c. The scan chain register 20 is provided with a serial input port SI, a serial output port SO, a parallel input port DI0–DIn and a parallel output port DO0–DOn. By setting the toggle signal TOG high and the scan enable signal $SE_i$ high, a toggle operation can be performed in-sync with a launch edge of the clock signal CLK. This toggle operation will cause all of the data signals at the parallel output port DO0–DOn to be inverted to thereby facilitate a scan test operation. Moreover, this toggle operation will not be functionally dependent on the values of any of the data signals at the parallel output port DO0–DOn. Accordingly, if a scanned-in test vector equivalent to DO0–DOn= 101100 . . . 1 is loaded into the scan chain register 20 in a serial fashion (i.e., in-sync with a plurality of consecutive leading edges of the clock signal CLK), then the receipt of the launch edge of the clock signal CLK will cause each bit of this test vector to become inverted (i.e., DO0–DOn=010011 . . . 0).

Figure 2B:
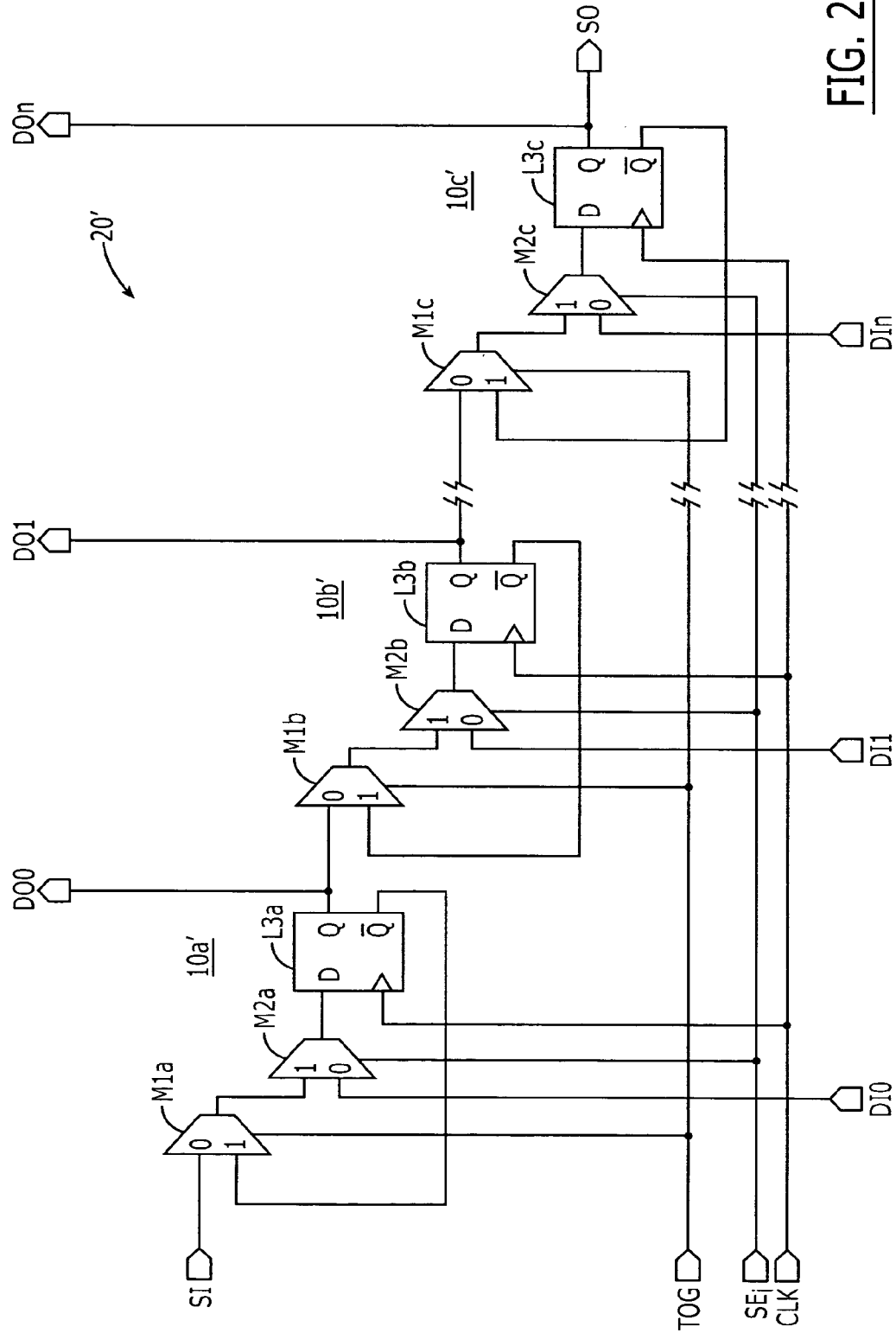
FIG. 2B is an electrical schematic of a portion of a scan chain register according to an embodiment of the present invention.
Figure 2C:
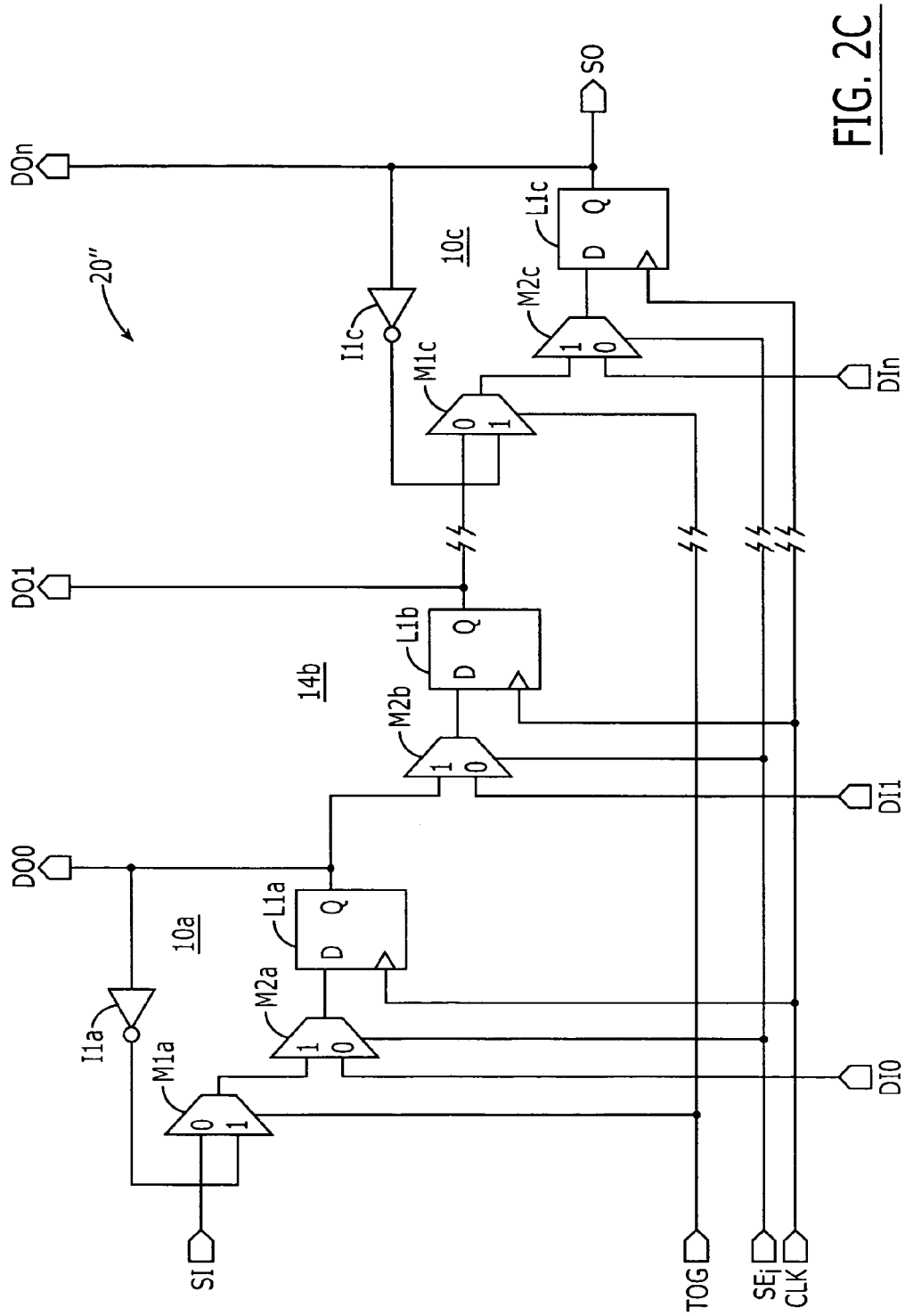
FIG. 2C is an electrical schematic of a portion of a scan chain register according to an embodiment of the present invention.
Figure 2D:
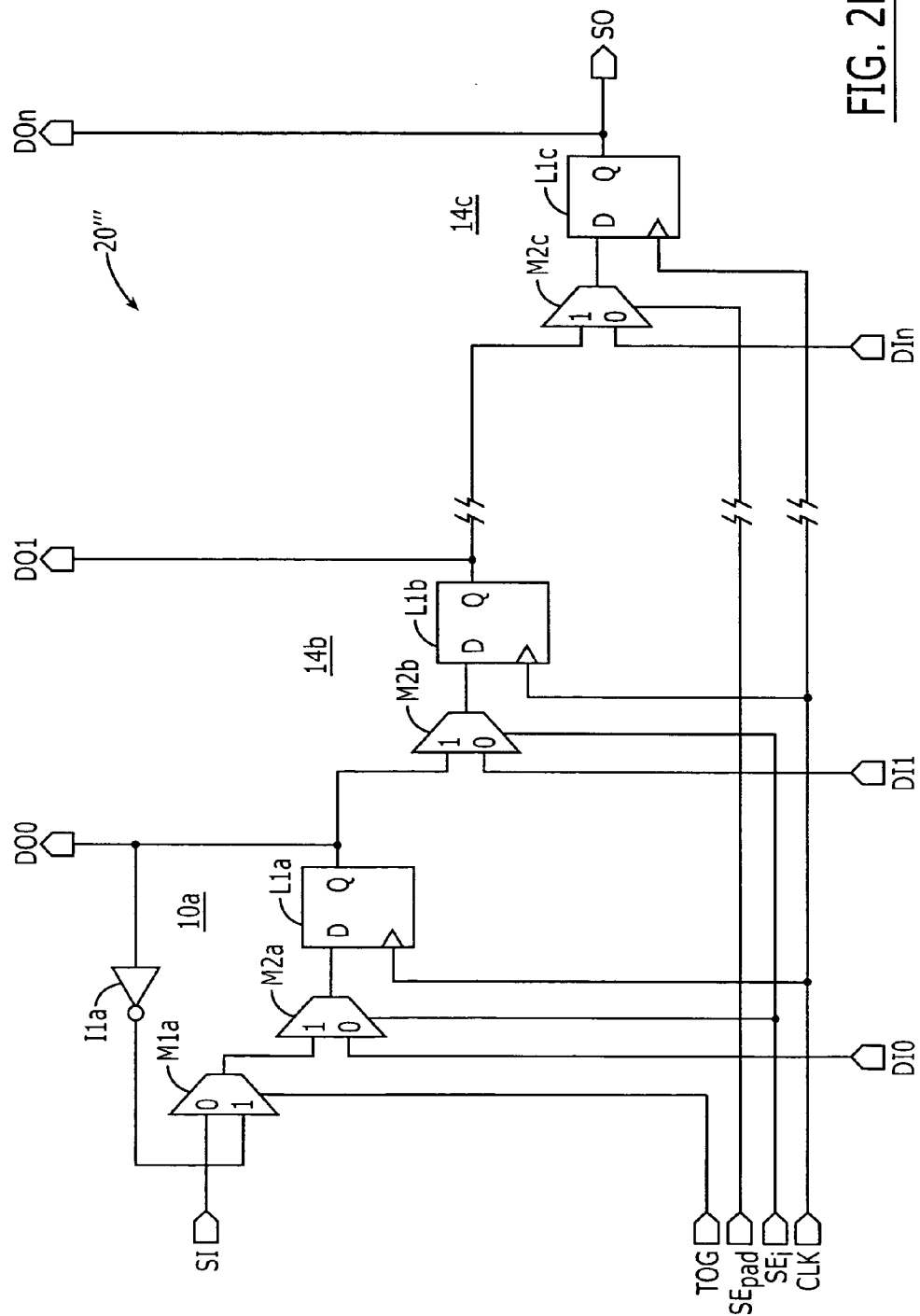
FIG. 2D is an electrical schematic of a portion of a scan chain register according to an embodiment of the present invention.

Referring now to FIG. 2B, an alternative scan chain register 20' is illustrated. This scan chain register 20' is similar to the scan chain register 20 of FIG. 2A, however, the scan chain latch units 10a'–10c' have been modified to include latches L3a, L3b and L3c, respectively. These latches L3a, L3b and L3c have true and complementary outputs Q and /Q. These complementary outputs /Q are fed back to corresponding inputs of the first multiplexers M1a, M1b and M1c, as illustrated. The use of complementary outputs /Q with each latch L3a, L3b and L3c eliminates the requirement of using inverters within the feedback paths of the scan chain latch units. The scan chain register 20" of FIG. 2C is illustrated as including one (or more) conventional scan chain latch unit 14b within the chain, which is not configured to perform a toggle operation as described herein. Thus, it is not necessary that every scan chain latch unit within a scan chain register 20" be configured to perform a toggle operation as described above with respect to FIGS. 1A–1B. The scan chain register 20''' of FIG. 2D is illustrated as including three different configurations of scan chain latch units. The use of different scan chain latch units supports reduction in hardware (e.g., transistor count) and optimization for each configuration of combinational logic connected to the parallel data outputs DO0–DOn. The scan chain latch units 10a and 14b are similar to those illustrated by FIG. 2C, however, the scan chain latch unit 14c is illustrated as being responsive to the scan enable pad signal $SE_{pad}$. Based on the timing diagram of FIG. 1B, upon receipt of the launch edge of the clock signal CLK, the next state (NS) of the output of the scan chain latch unit 14c will be equivalent to the value of the data at the parallel input port DIn.

Figure 3A:
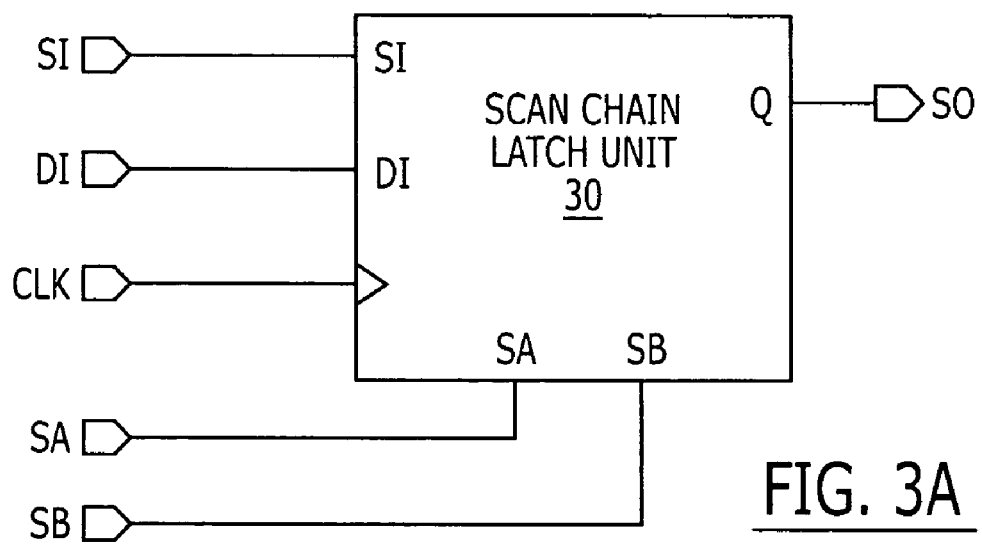
FIG. 3A is a block diagram of a scan chain latch unit according to an embodiment of the present invention.
Figure 3B:
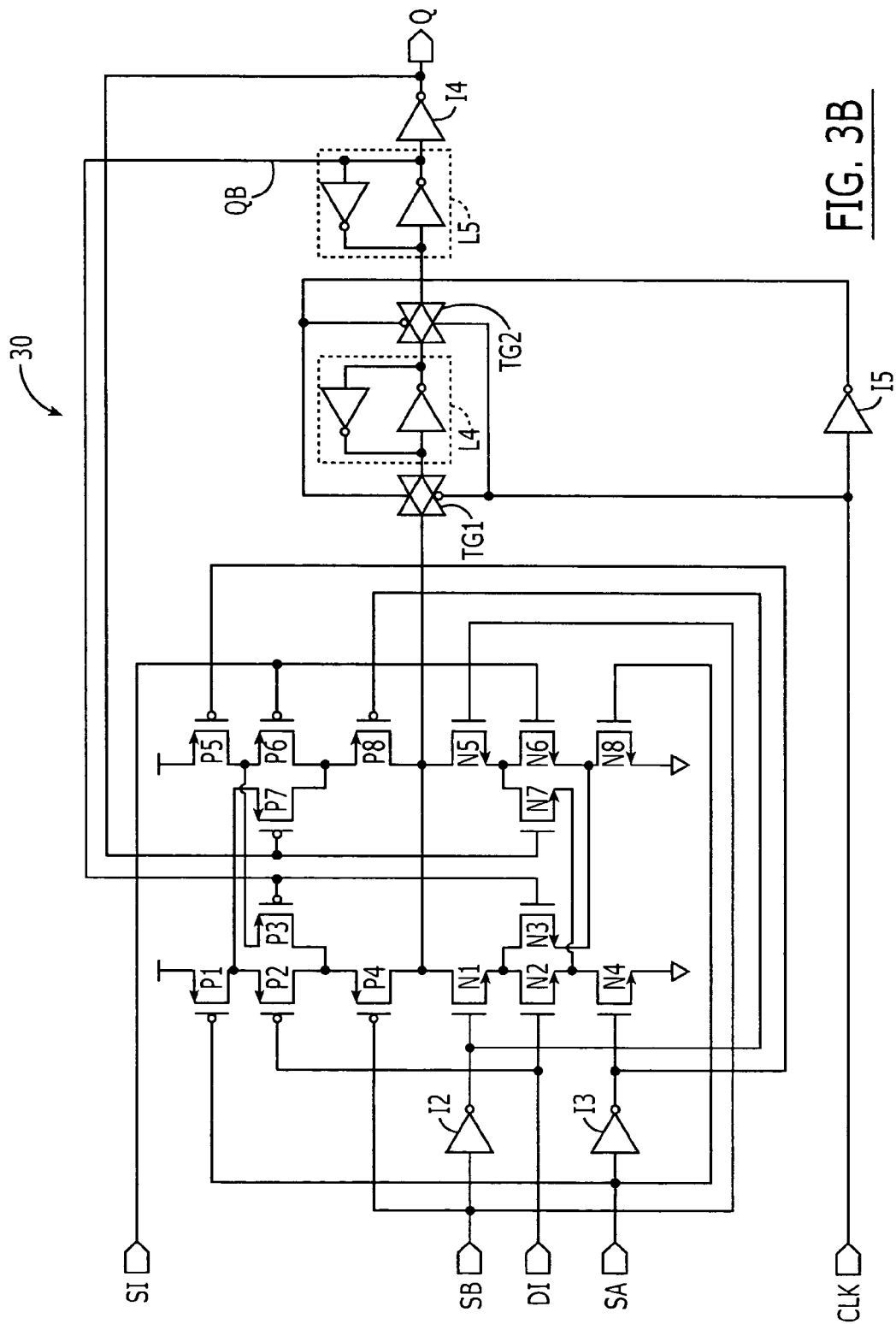
FIG. 3B is an electrical schematic of an embodiment of the scan chain latch unit of FIG. 3A.

As illustrated by FIGS. 3A–3B, alternative embodiments of a scan chain latch unit 30 may be configured to support a toggle mode of operation and a freeze mode of operation.

The toggle and freeze modes, which are synchronized with the clock signal CLK, may utilize a pair of feedback paths that are each selectively enabled to pass data to support a respective one of the toggle and freeze modes. Other embodiments of the scan chain latch unit 30 that do not utilize feedback paths to support the toggle and freeze modes may also be implemented. In the toggle mode of operation, the next output state (NS) of the scan chain latch unit 30 equals an opposite of the current output state (CS) of the scan chain latch unit 30 (i.e., NS=/CS, where "/" designates an inversion operation). The scan chain latch unit 30 is similar to the scan chain latch unit 10 of FIG. 1A, however, the two select signals (TOG and $SE_i$) in FIG. 1A have been replaced by a pair of select signals SA and SB. This pair of select signals SA and SB enables selection between as many as four modes of operation. In addition to the toggle and freeze modes, two additional modes of operation include: (i) a "scan-in" mode whereby the next state of the latch unit 30 is equivalent to the data at the serial input port (SI) of the latch unit 30 when a next leading edge of the clock signal CLK is received and (ii) a "data-in" mode whereby the next state of the latch unit 30 is equivalent to the data at the parallel data input port (DI) of the latch unit 30 when a next leading edge of the clock signal CLK is received. The four possible combinations of the select signals SA and SB are illustrated more fully by TABLE 1. With these select signals, as many as four states may be established at an output of a scan chain latch unit 30 in-sync with the clock signal CLK.

TABLE 1

| SA | SB | OUTPUT OF SCAN CHAIN LATCH UNIT 30 |
|---|---|---|
| 0 | 0 | NS = DI; NORMAL LOGIC OPERATION |
| 0 | 1 | NS = Q; FREEZE MODE FOR SPEED TEST |
| 1 | 0 | NS = QB; TOGGLE MODE FOR SPEED TEST |
| 1 | 1 | NS = SI; SCAN-IN MODE FOR SCAN CHAIN SHIFTING |

FIG. 3B illustrates a detailed electrical schematic of one embodiment of the scan chain latch unit 30 of FIG. 3A. This electrical schematic includes two totem pole arrangements of PMOS and NMOS transistors having commonly connected outputs, which are provided as an input to a first transmission gate TG1. The first totem pole arrangement of transistors includes PMOS transistors P1–P4 and NMOS transistors N1–N4, connected as illustrated. The second totem pole arrangement of transistors includes PMOS transistors P5–P8 and NMOS transistors N5–N8. These two totem pole arrangements of transistors operate as a 4-input multiplexer that is responsive to the two select signals SA and SB. The four data inputs of the multiplexer include the serial input port (SI), the data input port (DI), a first feedback path, which electrically connects a complementary output (QB) of a latch unit to gate terminals of PMOS transistor P3 and NMOS transistor N3, and a second feedback path, which electrically connects a true out (Q) of the latch unit to gate terminals of PMOS transistor P7 and NMOS transistor N7. Inverters I2 and I3 are also provided for inverting the select signals SA and SB. The latch unit is illustrated as including a first latch, which is synchronized with a clock signal CLK, and a second latch connected to an output of the first latch. This first latch includes a first pair of inverters connected in antiparallel (L4), first and second transmission gates TG1 and TG2, which are synchronized with the clock signal CLK, and an inverter I5 which generates a complement of the clock signal CLK. The second latch includes a second pair of inverters connected in antiparallel (L5) and an output inverter I4. The second latch is configured to generate the true output signal Q and the complementary output signal QB.

Based on the illustrated configuration of the scan chain latch unit 30 of FIG. 3B, setting the select signals SA and SB to a value of "00" will operate to turn on NMOS transistors N1 and N4 and PMOS transistors P1 and P4. When this occurs, the value of the data at the data input port DI will operate to pull the output of the first totem pole arrangement high when DI=0 or low when DI=1. In contrast, setting the select signals SA and SB to a value of "11" will operate to turn on NMOS transistors N5 and N8 and PMOS transistors P5 and P8. When this occurs, the value of the data at the serial input port SI will operate to pull the output of the first totem pole arrangement high when SI=0 or low when SI=1. Setting the select signals SA and SB to a value of "01" will operate to turn on NMOS transistors N4 and N5 and PMOS transistors P1 and P8. When this occurs, the value of the feedback signal line Q will operate to pull the output of the first totem pole arrangement high when Q=0 and PMOS transistor P7 is "on" or low when Q=1 and NMOS transistor N7 is "on". Finally, setting the select signals SA and SB to a value of "10" will operate to turn on NMOS transistors N1 and N8 and PMOS transistors P4 and P5. When this occurs, the value of the feedback signal line QB will operate to pull the output of the first totem pole arrangement high when QB=0 and PMOS transistor P3 is "on" or low when QB=1 and NMOS transistor N3 is "on".

When the clock signal CLK is low (CLK=0), the output of the 4-input multiplexer is passed to an input of the first latch while the output of the first latch remains in a high impedance state by virtue of the fact that the second transmission gate TG2 is "off". When the clock signal CLK switches high (e.g., when a "launch" edge of the clock signal CLK occurs), the first transmission gate TG1 is turned off, the second transmission gate TG2 is turned on and the data at the output of the first pair of inverters L4 is passed to an input of the second pair of inverters L5 and the next state values of Q and QB are established. These values Q and QB are fed back to inputs of the 4-input multiplexer.

Figure 3C:
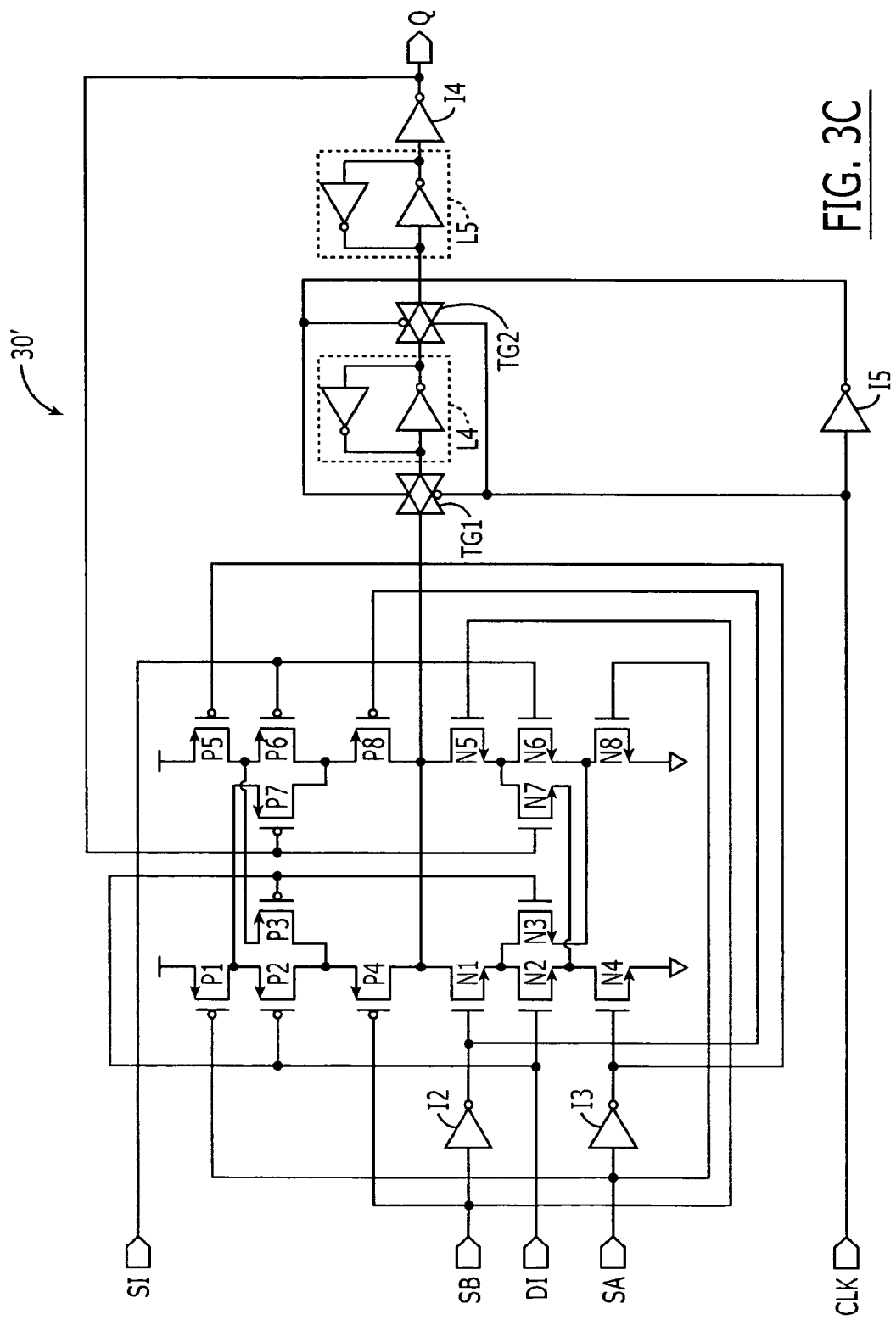
FIG. 3C is an electrical schematic of an embodiment of the scan chain latch unit of FIG. 3A.
Figure 3D:
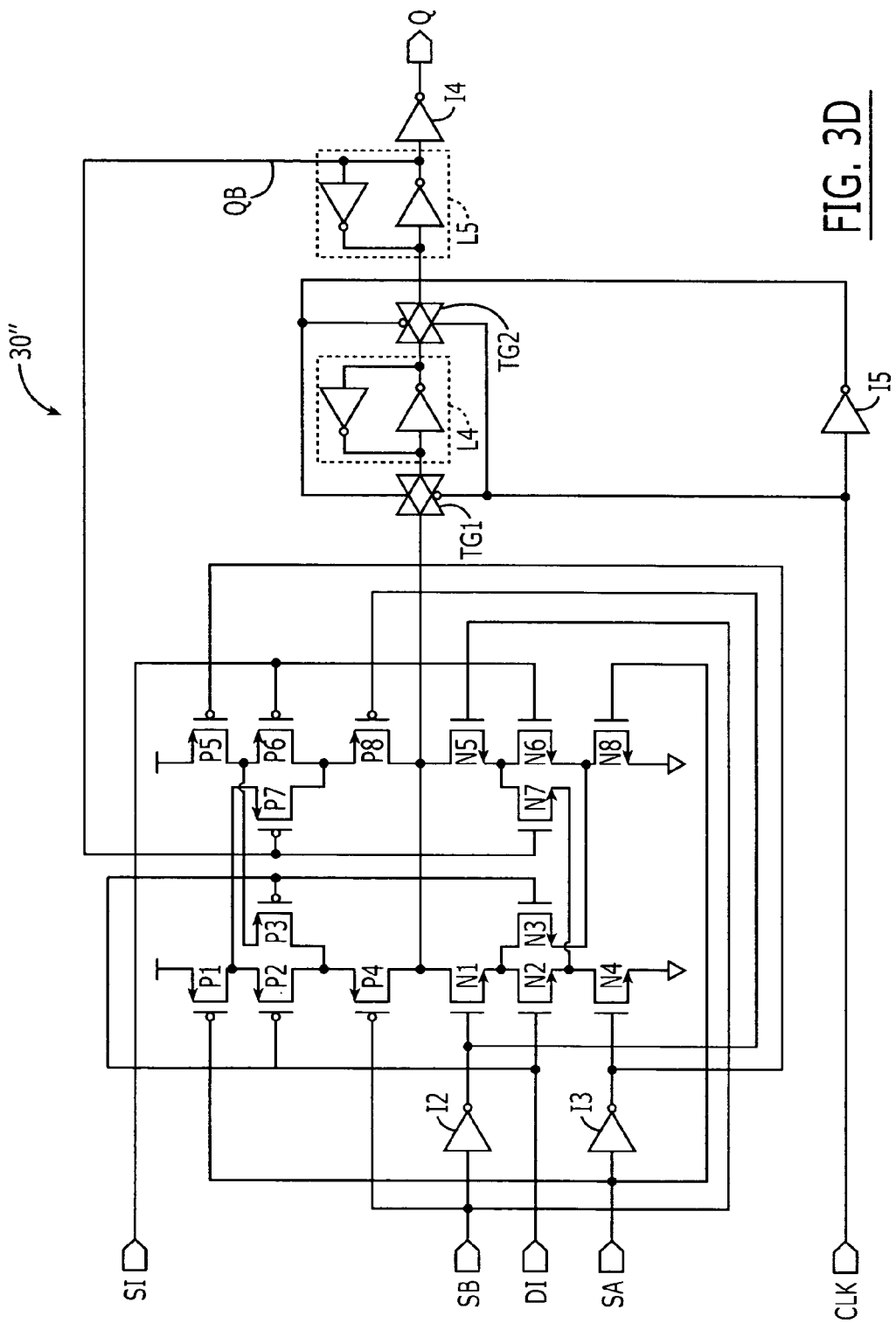
FIG. 3D is an electrical schematic of an embodiment of the scan chain latch unit of FIG. 3A.
Figure 3E:
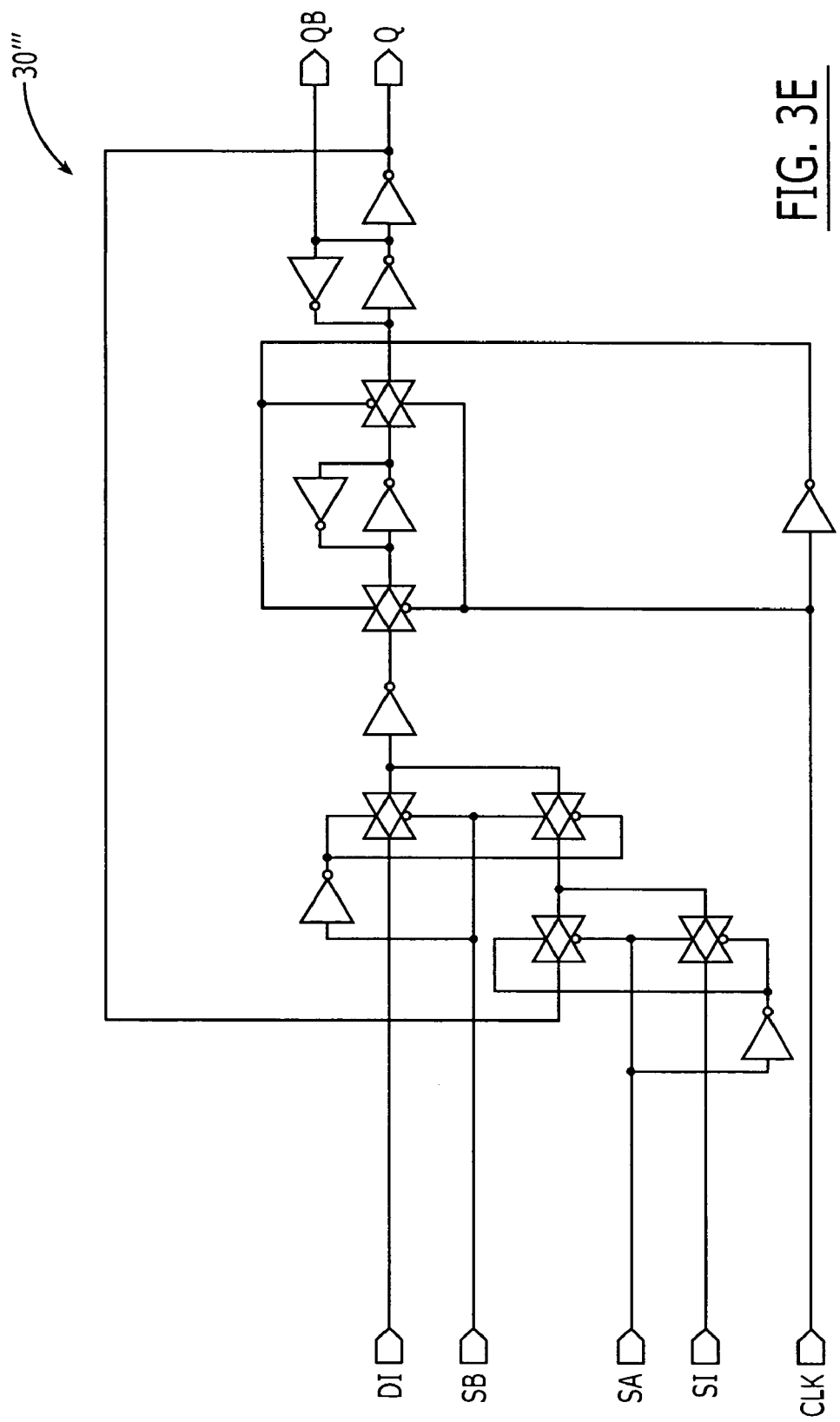
FIG. 3E is an electrical schematic of an alternative embodiment of the scan chain latch unit of FIG. 3C.
Figure 3F:
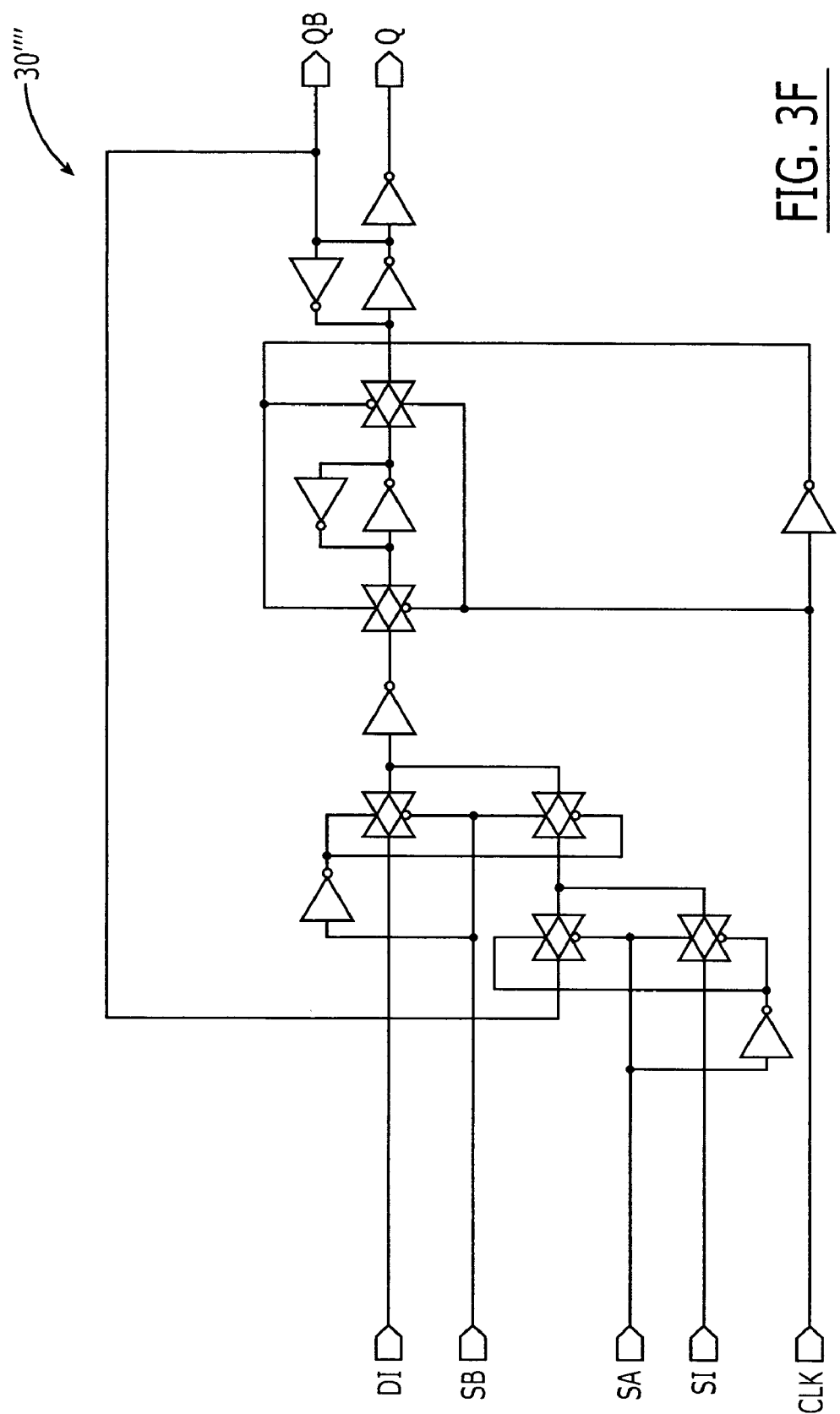
FIG. 3F is an electrical schematic of an alternative embodiment of the scan chain latch unit of FIG. 3D.

The scan chain latch unit 30' of FIG. 3C represents an alternative scan chain latch unit embodiment that utilizes a single feedback path from the true output Q and a feed-forward path from the data input port DI. As illustrated by TABLE 2, this scan chain latch unit 30' supports a freeze mode of operation but not a toggle mode of operation. A more preferred embodiment of the scan chain latch unit 30' of FIG. 3C is illustrated by the scan chain latch unit 30''' of FIG. 3E, which has a reduced transistor count. The scan chain latch unit 30'' of FIG. 3D represents yet another scan chain latch unit embodiment that utilizes a single feedback path from the complementary output QB and a feed-forward path from the data input port DI. As illustrated by TABLE 2, this scan chain latch unit 30'' supports a toggle mode of operation but not a freeze mode of operation. A more preferred embodiment of the scan chain latch unit 30'' of FIG. 3D is illustrated by the scan chain latch unit 30'''' of FIG. 3F, which has a reduced transistor count.

TABLE 2

| SA | SB | OUTPUT OF LATCH UNIT 30' and 30''' | OUTPUT OF LATCH UNIT 30'' and 30'''' |
|---|---|---|---|
| 0 | 0 | NS = DI; NORMAL OPERATION | NS = DI; NORMAL OPERATION |
| 0 | 1 | NS = Q; FREEZE MODE | NS = QB; TOGGLE MODE |

TABLE 2-continued

| SA | SB | OUTPUT OF LATCH UNIT 30' and 30''' | OUTPUT OF LATCH UNIT 30'' and 30'''' |
|---|---|---|---|
| 1 | 0 | NS = DI; NORMAL OPERATION | NS = DI; NORMAL OPERATION |
| 1 | 1 | NS = SI; SCAN-IN MODE | NS = SI; SCAN-IN MODE |

Figure 4A:
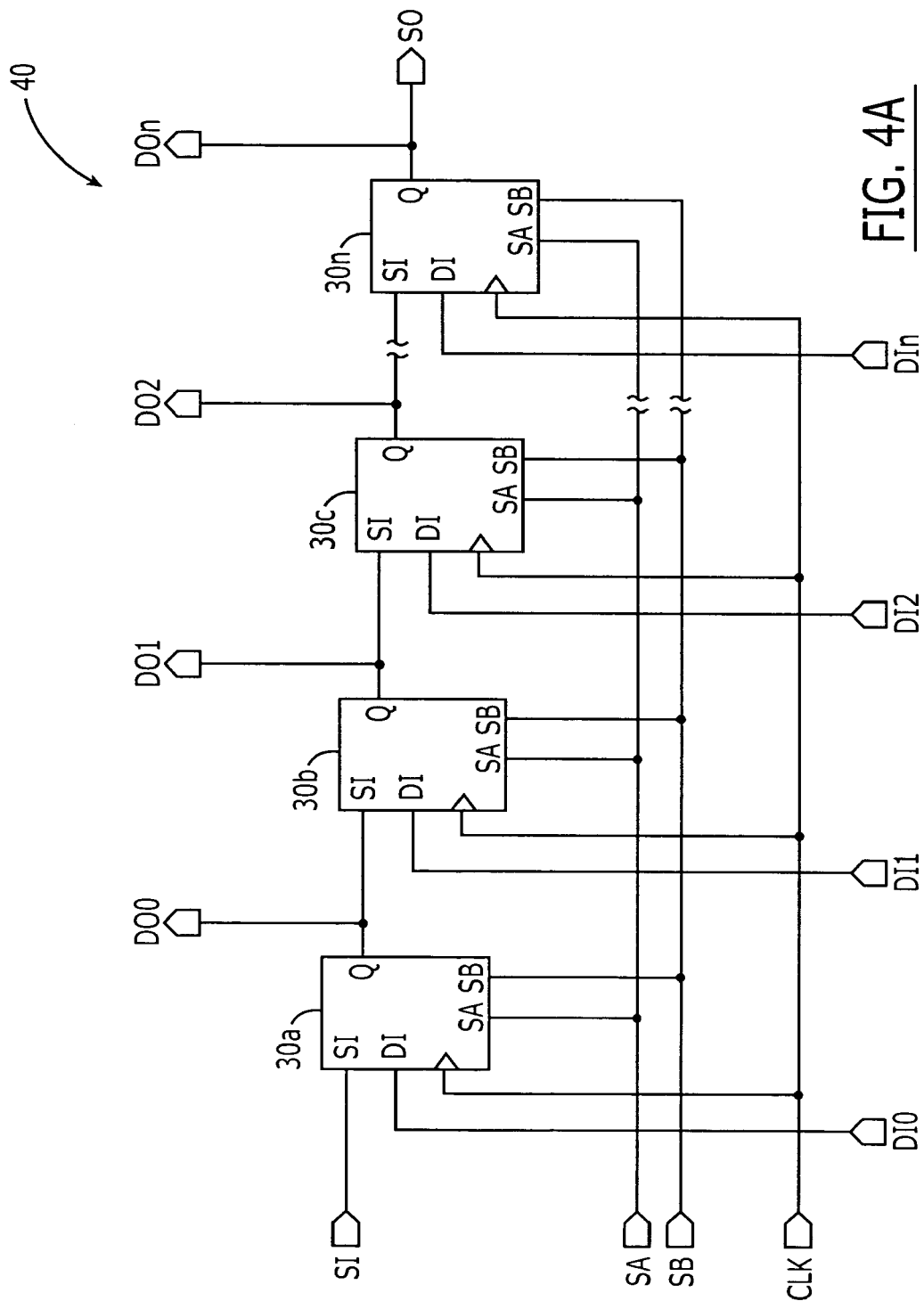
FIG. 4A is an electrical schematic of a portion of a scan chain register according to an embodiment of the present invention.

As illustrated by FIG. 4A, a scan chain register 40 according to another embodiment of the present invention includes a plurality of scan chain latch units 30a–30n, which are illustrated in greater detail by FIGS. 3A–3B. This scan chain register 40 supports the four modes of operation illustrated by TABLE 1, with the SA and SB select terminals of the illustrated units 30a–30n being connected to select lines SA and SB, respectively. Based on this configuration of the select lines and terminals, each of the scan chain latch units 30a–30n will operate in the same mode of operation at all times. In contrast, the segment of a scan chain register 40' illustrated by FIG. 4B demonstrates how a first select terminal SA of one scan chain latch unit 30e may be connected to a second select terminal SB of another scan chain latch unit 30f by a first select line S1. Similarly, the first select terminal SB of the scan chain latch unit 30e may be connected to a second select terminal SA of the scan chain latch unit 30f by a second select line S2. Based on this illustrated configuration, disposing the scan chain latch unit 30e in a toggle mode of operation by setting S1, S2 equal to 10 will operate to dispose the scan chain latch unit 30f in a freeze mode of operation. Likewise, disposing the scan chain latch unit 30e in a freeze mode of operation by setting S1, S2 equal to 01 will operate to dispose the scan chain latch unit 30f in a toggle mode of operation.

This configuration of the scan chain latch units 30e and 30f enables at-speed testing of combinational logic devices. For example, all of the possible speed paths that can be tested in the two-input NAND gate ND1 illustrated by FIG. 4B may be tested at-speed using the four test sequences illustrated by TABLE 3. The four test sequences also demonstrate the independence of the next states (NS) on the data values established at the serial input ports (SI) and the data input ports (DI) of the illustrated scan chain latch units 30e and 30f.

TABLE 3

|  | Z falling | | Z rising | | |
|---|---|---|---|---|---|
|  | CS | NS | CS | CS | NS |
| X | 1 | 0 (NS = CS) | 1 (NS = /CS) | 0 (NS = CS) | 1 (NS = /CS) |
| Y | 1 | 0 (NS = /CS) | 1 (NS = CS) | 0 (NS = /CS) | 1 (NS = CS) |
| S1 S2 | 01 | 10 | 01 | 10 | |

Figure 4B:
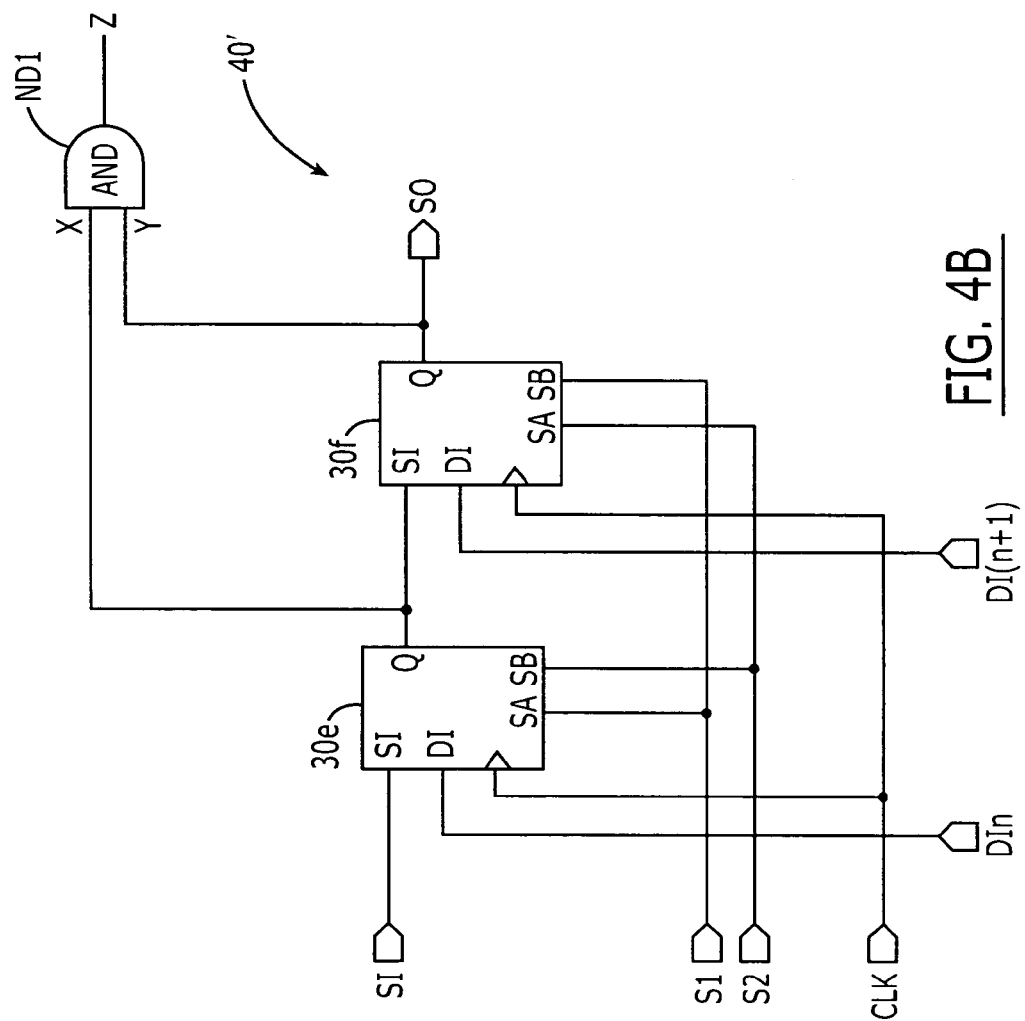
FIG. 4B is an electrical schematic of a portion of a scan chain register according to an embodiment of the present invention.

In the event the 2-input NAND gate ND1 of FIG. 4B is replaced by a 2-input XOR gate, then TABLE 4 illustrates the eight test sequences that may be required to test the 2-input XOR gate, with each sequence being independent of the data values established at the serial input ports (SI) and the data input ports (DI) of the illustrated scan chain latch units 30e and 30f.

TABLE 4

|  | Z rising | | | | Z falling | | | |
|---|---|---|---|---|---|---|---|---|
|  | CS | NS | CS | NS | CS | NS | CS | NS |
| X | 0 | 0 | 1 | 1 | 0 | 1 | 0 | 0 | 1 | 1 | 0 | 1 |
| Y | 0 | 1 | 0 | 1 | 1 | 0 | 1 | 0 | 1 | 0 | 0 | 1 |
| S1 S2 |  | 01 |  | 10 |  | 10 | 01 |  | 01 | 10 |  | 10 | 01 |

Figure 4C:
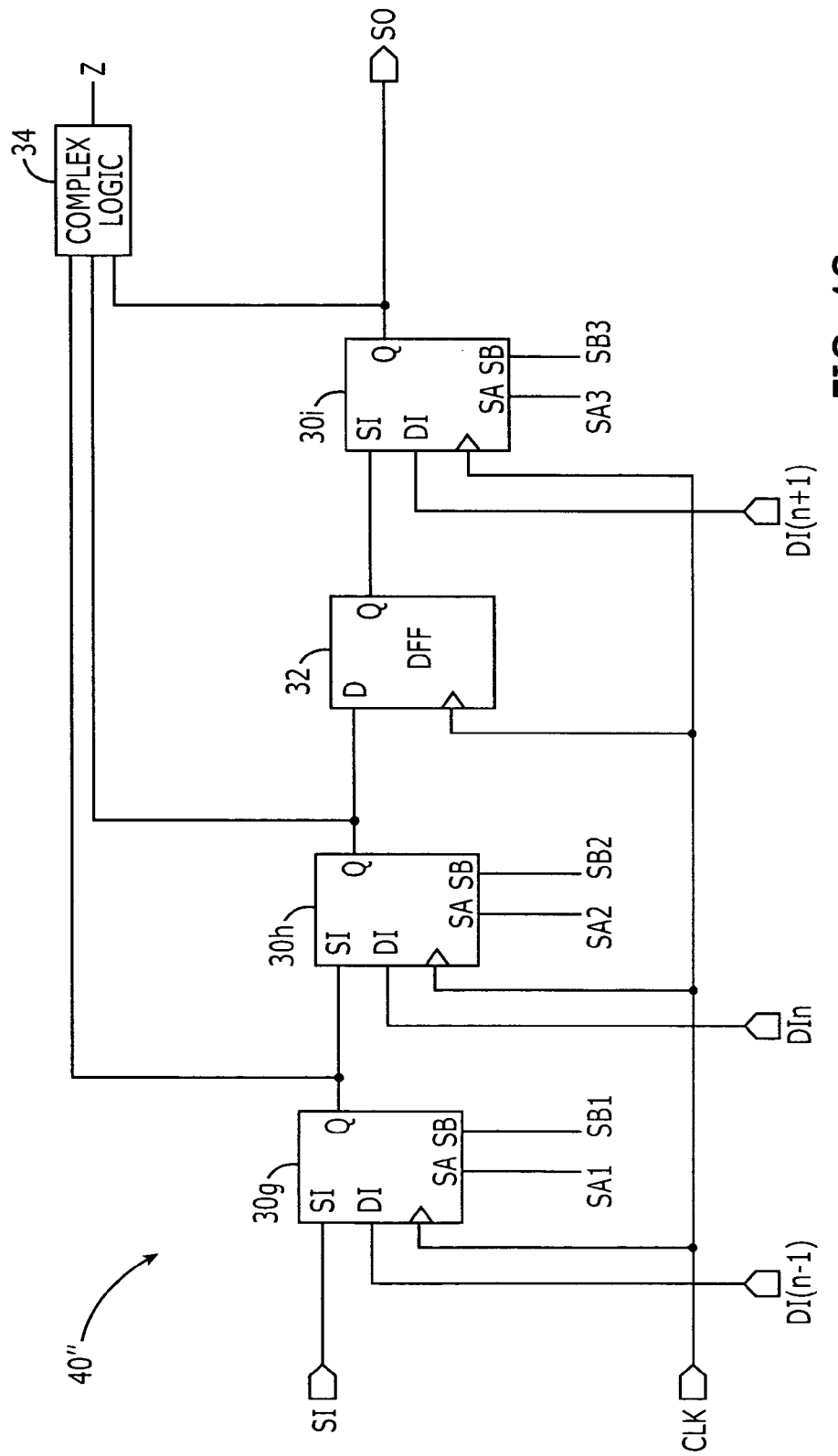
FIG. 4C is an electrical schematic of a portion of a scan chain register according to an embodiment of the present invention.

Increased controllability may also be achieved for more complex applications by inserting one or more dummy flip-flops into a scan chain register. As illustrated by FIG. 4C, a scan chain register 40'' may include a plurality of scan chain latch units 30g–30i and at least one dummy flip-flop 32, which is illustrated as a D-type flip-flop. Each of these latch units 30g–30i may be configured as illustrated by FIGS. 3B–3F, however, other configurations of the latch units (not shown herein) may also be possible. Moreover, the latch units 30g–30i need not be equivalent. The inputs (SA1, SB1), (SA2, SB2) and (SA3, SB3) to each of the scan chain latch units 30g–30i may be connected to respective pairs of terminals or may be connected in different ways to a single pair of input terminals (e.g., S1 and S2) to achieve desired functions for each of the latch units. The inclusion of this dummy flip-flop 32 (and others at strategic locations within the scan chain register 40'') may enable the at-speed testing of complex logic 34 with 100 percent controllability of the third input to the complex logic 34 (i.e., the last input of the complex logic 34 that is connected to output of scan chain latch unit 30i), albeit using a somewhat longer scan chain register 40''. The inclusion of one or more dummy flip-flops can enable all speed paths within the complex logic 34 to be checked using a smaller number of test vectors. As illustrated, the dummy flip-flop 32 may be programmed to store a desired next state for the following scan chain latch unit 30i when the corresponding select signals SA3 and SB3 are set to a predetermined value. This value may equal a 11 value (i.e., SA3=SB3=1) in the event the latch unit 30i is configured to operate in accordance with TABLES 1–2, however, alternative configurations of the latch unit 30i (not shown herein) may also be utilized to achieve the desired operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A scan chain register, comprising:
  a scan chain latch unit responsive to at least one select signal and a clock signal, said scan chain latch unit configured to support a toggle mode of operation that establishes a next output state of said scan chain latch unit as an invert of a current output state of said scan chain latch unit and further configured to support a freeze mode of operation that establishes the next output state of said scan chain latch unit as equivalent to the current output state of said scan chain latch unit, said scan chain latch unit comprising a multiplexer having four data input terminals and two control terminals that are responsive to a pair of select signals.

2. The scan chain register of claim 1, wherein said scan chain latch unit is configured to generate a true output state (Q) that is fed back to a first data input of the multiplexer and a complementary output state (QB) that is fed back to a second data input of the multiplexer.

3. The scan chain register of claim 2, wherein the multiplexer comprises first and second totem pole arrangements of PMOS and NMOS transistors having commonly connected outputs.

4. A scan chain register, comprising:
a scan chain latch unit having serial and parallel input ports and an output port, said scan chain latch unit configured to support at least a pair of freeze and toggle modes of operation that block data at the serial and parallel input ports from influencing CS-to-NS data transitions at the output port, where CS represents a current output state of said scan chain latch unit and NS represents a next output state of said scan chain latch unit; and
wherein said scan chain latch unit comprises a multiplexer having four data input terminals and two control terminals that are responsive to a pair of select signals.

5. The scan chain register of claim 4, wherein said scan chain latch unit is configured to generate a true output state (Q) that is fed back to a first data input of the multiplexer and a complementary output state (QB) that is fed back to a second data input of the multiplexer.

6. The scan chain register of claim 5, wherein the multiplexer comprises first and second totem pole arrangements of PMOS and NMOS transistors having commonly connected outputs.

7. A scan chain register, comprising:
a first scan chain latch unit having a first serial input port, a first parallel input port and a first output port, said first scan chain latch unit responsive to a clock signal and configured to support toggle and freeze modes of operation in response to a pair of select signals;
a second scan chain latch unit having a second serial input port, a second parallel input port and a second output port, said second scan chain latch unit responsive to the clock signal and the pair of select signals; and
a dummy flip-flop having a data input electrically coupled to the first output port of said first scan chain latch unit, a clock input responsive to the clock signal and a data output electrically coupled to the second serial input port of said second scan chain latch unit.

* * * * *